Sept. 23, 1969 S. L. STARGER 3,469,017

ENCAPSULATED SEMICONDUCTOR DEVICE HAVING INTERNAL SHIELDING

Filed Dec. 12, 1967

Inventor:
SAMUEL L. STARGER
By M. Y. Epstein
Attorney

United States Patent Office 3,469,017
Patented Sept. 23, 1969

3,469,017

ENCAPSULATED SEMICONDUCTOR DEVICE HAVING INTERNAL SHIELDING

Samuel L. Starger, Clark, N.J., assignor to RCA Corporation, a corporation of Delaware Filed Dec. 12, 1967, Ser. No. 689,993
Int. Cl. H05k 5/04
U.S. Cl. 174—52 4 Claims

ABSTRACT OF THE DISCLOSURE

A semiconductor device is fabricated from an assembly comprising a lead frame, a substrate, and a semiconductor pellet. The lead frame comprises a flat sheet of metal having a cut-out therethrough providing a plurality of elongated leads. Insulatingly bonded to one side of the lead frame is an electrically conductive substrate. A semiconductor pellet is mounted on the substrate. Different portions of the pellet and the metal substrate are electrically connected to different ones of the leads. The pellet and portions of the substrate and leads are encapsulated in a molded enclosure, and the portions of the lead frame connecting the leads together are removed to separate the leads and complete the device.

BACKGROUND OF THE INVENTION

Ths invention relates to semiconductor devices and particularly to semiconductor devices utilizing lead-frame assemblies.

In the fabrication of certain types of semiconductor devices, e.g., integrated circuits, a semiconductor pellet is mounted on a lead frame comprising a metal plate having a cut-out therethrough providing a plurality of elongated, inwardly converging leads. Different ones of the inner ends of the leads are electrically connected to different portions of the pellet as, e.g., by fine wires. Preferably, to obtain small package size and small lead capacitance, the leads are thin and narrow. The pellet-frame assembly is encapsulated, as by molding a plastic-like encapsulating material around the pellet, the connector wires, and the inner portions of the elongated leads. The portions of the metal frame joining the leads together are then removed, to separate the leads, as by stamping.

One problem with semiconductor devices of the type described is that the encapsulated devices contain little internal electrostatic shielding. Such shielding is desirable for high efficiency operation of the devices when used at high frequencies. Another problem is that the thin lead frame on which the pellet is mounted is relatively ineffective as a heat sink for dissipating heat generated in the pellet during operation of the device. Also, the lead frame is fragile, thereby giving rise to damage to the device during the mounting of the pellet on the lead frame and the bonding of the connecting wires to the pellet and the leads.

SUMMARY OF THE INVENTION

A semiconductor pellet-lead frame assembly is provided comprising a lead frame formed from a flat sheet of metal having a cut-out therethrough providing a plurality of elongated leads. Bonded to one side of the lead frame, and rigidly supporting the leads of the frame, is an electrically conductive substrate. To serve effectively as an electrostatic shield, the conductive substrate should be as close as possible to the semiconductor pellet and its connecting wires. However, to prevent electrical shorting of the leads to one another, the substrate should be electrically insulated from the leads. To these ends, the substrate comprises a plate of metal, such as aluminum, having a thin covering layer of insulating material. The insulating layer of the substrate is bonded to the lead frame as, e.g., by a thin layer of epoxy cement. A semiconductor pellet is mounted on the substrate, either directly thereon or on one of the leads bonded to the substrate. Different portions of the pellet are connected to different ones of the leads.

DESCRIPTION OF THE PREFERRED EMBODIMENTS

Figure 1:
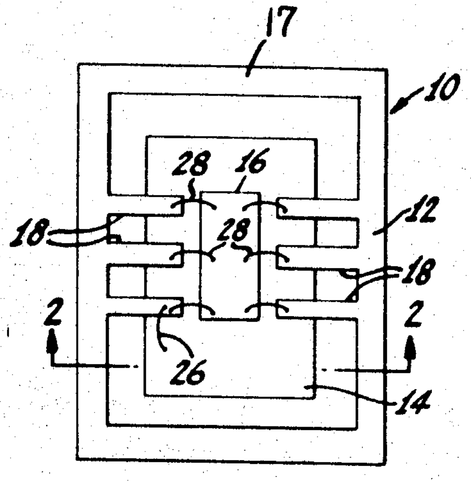
FIGURE 1 is a plan view of a pellet-lead frame assembly according to one embodiment of the invention.
Figure 2:
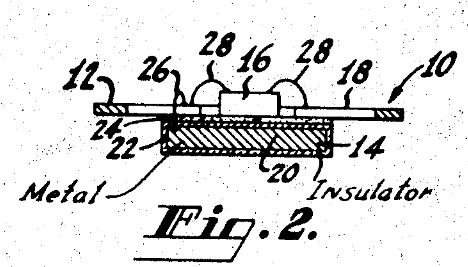
FIGURE 2 is a section along line 2—2 of FIGURE 1.

With reference to FIGURES 1 and 2, an assembly 10 is shown which comprises a lead frame 12, a substrate 14, and a semiconductor pellet 16.

The lead frame 12 is a flat sheet of metal, such as steel, copper, a nickel-iron-cobalt alloy sold under the trade name of Kovar, or the like, and has a thickness in the order of 10 mils. The frame 12 includes a rectangular ring 17 and a plurality of elongated leads 18 extending inwardly therefrom. The lead frame 12 can be provided by known means, such as by stamping or etching. Preferably, for small package size and low inter-lead capacity, the leads 18 are thin and narrow. In one embodiment, the leads 18 have a width of 15 mils and a length in the order of 100 mils.

The substrate 14 comprises a rigid plate 20 of metal, such as aluminum, copper, molybdenum, or the like, having a thin insulating coating 22 thereon. In a preferred embodiment, the substrate 14 comprises aluminum which is surface anodized (i.e., converted to a stable oxide of aluminum) to a thickness in the order of 2 mils, and preferably as thin as 0.2 mil. Magnesium, although not having a thermal conductivity as good as that of aluminum, is another material that can be surface anodized and used for the substrate 14. Surface anodizing of metals is known.

Alternately, the metal plate of the substrate 14 can be coated with a thin organic resin insulating material, such as a polyimide, epoxy, or the like. Such coatings, as known, can be applied with a thickness in the order of 2 mils and less.

The substrate 14 is bonded to the inner ends of the leads 18 as with a thin layer 24 of an epoxy cement, such as the Shell Oil Company's "Epon 1001." By using clamping pressures during setting of the cement, the bonding layer 24 can be made to have a thickness in the order of 1 mil or less.

For effective shielding of the pellet 16 and the pellet connecting wires, the conductive portion 20 of the substrate 14 should be as close to the pellet and wires as possible. An advantage of the coated metal substrates and bonding procedures described is that close spacings and effective shielding can be obtained.

To electrically ground the substrate 14, the insulating coating 22 and the bonding layer 24 are pierced, as with a sharp tool, and a fine wire 26 is bonded between the substrate 14 and one of the leads 18.

The semiconductor pellet 16 is mounted on the insulating coating 22 of the substrate 14, as with an epoxy cement. The pellet 16 can comprise, e.g., various active and passive devices providing an integrated circuit. Different surface contacts of the pellet 16 are electrically connected to different ones of the leads 18 by wires 28. The bonding of connecting wires 28 between semiconductor pellets and leads, as by welding, is known.

In the embodiment as described above, the substrate 14 provides support for the leads 18, serves as a heat sink for the pellet 16, and provides internal shielding for the semiconductor device.

In another embodiment, not illustrated, the insulating layer 22 on the substrate 14 is partly removed to expose a portion of the underlying metal of the substrate, and the pellet 16 is directly electrically connected to the substrate, as by means of a brazed bond.

An advantage of the pellet-lead frame assemblies 10 described is that they are relatively strong and rigid, whereby damage to the assembly is minimized during mounting of the pellet 16 on the lead frame 12, bonding the connecting wires 26 to the pellet 16 and leads 18, and subsequent handling of the device.

Figure 3:
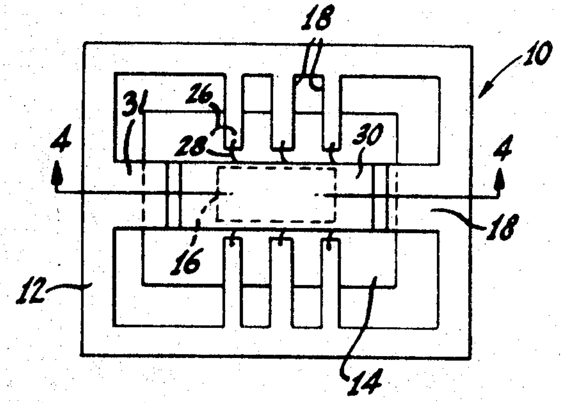
FIGURE 3 is a plan view of a pellet-lead frame assembly according to a different embodiment of the invention.
Figure 4:
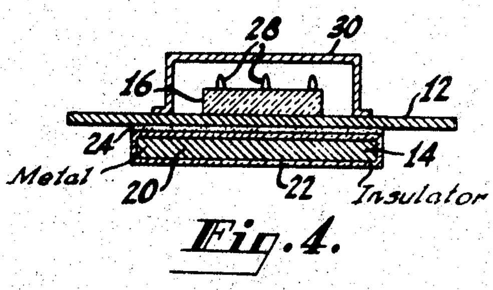
FIGURE 4 is a section along line 4—4 of FIGURE 3.

In another embodiment of the invention, shown in FIGURES 3 and 4, the shielding provided by the electrically conductive substrate 14 is supplemented by an additional U-shaped shielding member 30 extending over the upper surface portion of the pellet 16 and the connecting wires 28. In this embodiment, the pellet 16 is mounted on a relatively wide lead 31 which extends across the rectangular ring 17. The shielding member 30 is electrically connected, as by welding, to the lead 31 on which the pellet is mounted.

Figure 5:
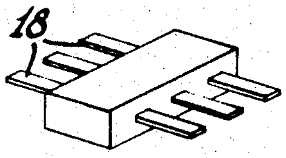
FIGURE 5 is a view in perspective showing a completed semiconductor device made according to the invention.

The completed assemblies are then encapsulated by molding a plastic-like encapsulating material, such as Dow Corning Corp. 306 Silicone Molding Compound, around the pellet 16, the connecting wires 26 and 28, the inner ends of the leads 18 (and the lead 31, if used), the substrate 14, and the shielding member 30, if used. To complete the device, the portions of the lead frame 12 joining the leads 18 are removed, as by stamping. The extending leads 18 are the device terminals. The encapsulated device is shown in FIGURE 5.

The substrate 14 serves as a heat sink for the pellet 16. In one embodiment, not illustrated, the lower surface of the substrate 14 is not encapsulated but is left exposed in the finished device. The exposed substrate surface can then be mounted directly on a chassis in the use of the device, or be exposed to a circulating fluid, such as air, to further effect heat removal from the semiconductor device.

What is claimed is:

1. A semiconductor device comprising:
a metal substrate;
a semiconductor pellet mounted on a first surface of said substrate;
an insulating coating on said first surface of said substrate;
a plurality of elongated conductors rigidly bonded to said coating in insulated relationship to said substrate and extending outwardly from said substrate;
means electrically connecting different portions of said pellet to different ones of said leads, and means electrically connecting said metal substrate to one of said leads; and
an insulating encapsulation enclosing said pellet, portions of said leads, and all of said substrate, said leads extending outwardly from said enclosure.

2. A device as in claim 1 wherein said substrate comprises an aluminum plate surface anodized to a depth in the order of 2 mils or less to provide said insulating coating.

3. A semiconductor device comprising:
a flat sheet of metal having a cut-out therethrough providing an array of elongated, inwardly extending leads;
a substrate comprising a metal plate and a thin layer of insulating material covering one side of said plate;
the insulated side of said substrate being rigidly bonded to the inner ends of said leads;
a semiconductor pellet mounted on said one side of said substrate, different ones of the inner ends of said leads being electrically connected to different portions of said pellet;
means for electrically connecting said metal substrate to one of said leads; and
an insulating encapsulation enclosing said pellet, the inner ends of said leads, and all of said substrate, said leads extending outwardly from said enclosure.

4. An assembly as in claim 3 wherein said substrate comprises an aluminum plate surface anodized to a depth in the order of 2 mils or less to provide said insulating layer.

References Cited

UNITED STATES PATENTS

| | | |
|---|---|---|
| 3,244,939 | 4/1966 | Sandbank. |
| 3,325,586 | 6/1967 | Suddick. |
| 3,340,347 | 9/1967 | Spiegler. |

DARRELL L. CLAY, Primary Examiner

U.S. Cl. X.R.

29—588, 627; 174—35; 317—101, 234